United States Patent [19]

Watanabe

[11] Patent Number: 5,091,762
[45] Date of Patent: Feb. 25, 1992

[54] SEMICONDUCTOR MEMORY DEVICE WITH A 3-DIMENSIONAL STRUCTURE

[75] Inventor: Toshiharu Watanabe, Yokohama, Japan

[73] Assignee: Kabushiki Kaisha Toshiba, Kawasaki, Japan

[21] Appl. No.: 626,404

[22] Filed: Dec. 14, 1990

Related U.S. Application Data

[63] Continuation of Ser. No. 358,278, May 30, 1989, abandoned.

[30] Foreign Application Priority Data

Jul. 5, 1988 [JP] Japan .................. 63-167601

[51] Int. Cl.$^5$ ........................... H01L 29/78
[52] U.S. Cl. .................. 357/23.6; 357/23.7; 357/49; 357/42; 357/55; 357/71; 357/75
[58] Field of Search ........... 357/75, 23.6, 23.7, 357/49, 42, 55, 71

[56] References Cited

U.S. PATENT DOCUMENTS

| | | | |
|---|---|---|---|
| 4,185,319 | 1/1980 | Stewart | 365/185 |
| 4,521,796 | 6/1985 | Rajkanan et al. | 357/23.5 |
| 4,729,005 | 3/1988 | Wei et al. | 357/30 |
| 4,733,291 | 3/1988 | Levy et al. | 357/68 |
| 4,852,271 | 4/1989 | Tanaka et al. | 357/23.5 |
| 4,881,105 | 11/1989 | Davari | 357/42 |

FOREIGN PATENT DOCUMENTS

| | | | |
|---|---|---|---|
| 0315803 | 5/1989 | European Pat. Off. | 357/23.6 |
| 2510982 | 9/1976 | Fed. Rep. of Germany . | |
| 58-112348 | 7/1983 | Japan . | |
| 60-98655 | 6/1985 | Japan . | |
| 61-105860 | 5/1986 | Japan . | |

OTHER PUBLICATIONS

Muller et al, *Device Electronics for IC's*, 1986, pp. 450-454.

'New Vertical Stacked Transistor...', IBM Tech., vol. 32, No. 3B, Aug. 89, pp. 177-182.

*Primary Examiner*—Andrew J. James
*Assistant Examiner*—Stephen D. Meier
*Attorney, Agent, or Firm*—Finnegan, Henderson, Farabow, Garrett, and Dunner

[57] ABSTRACT

A semiconductor memory device comprises a plurality of conductive planar members stacked while being spaced at predetermined distances, a plurality of conductive wires passing through the planar members, and switching elements and capacitance elements. Both types of elements are formed in the vicinity of each of the cross points of the conductive planar members and the wires.

4 Claims, 7 Drawing Sheets

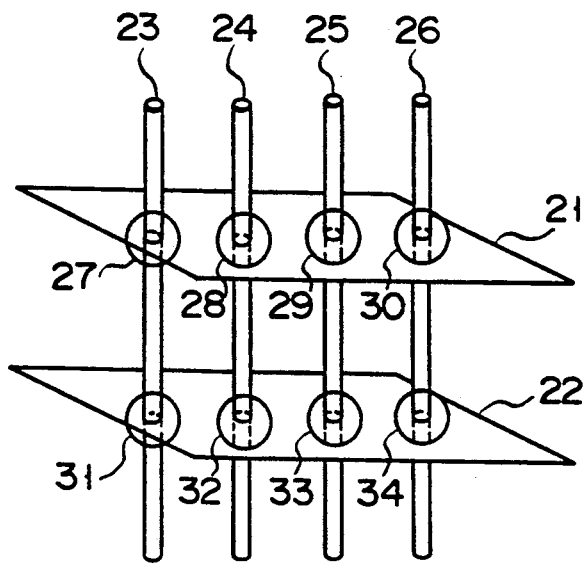
F I G. 1
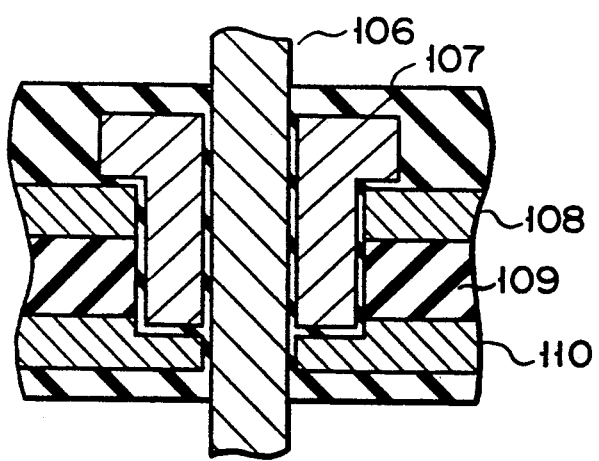
F I G. 7

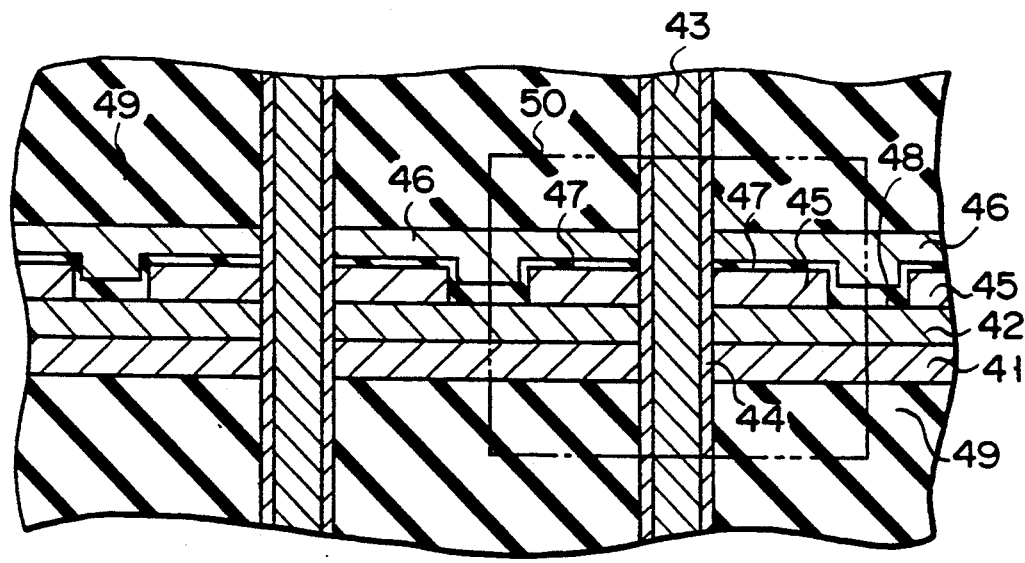
F I G. 2A
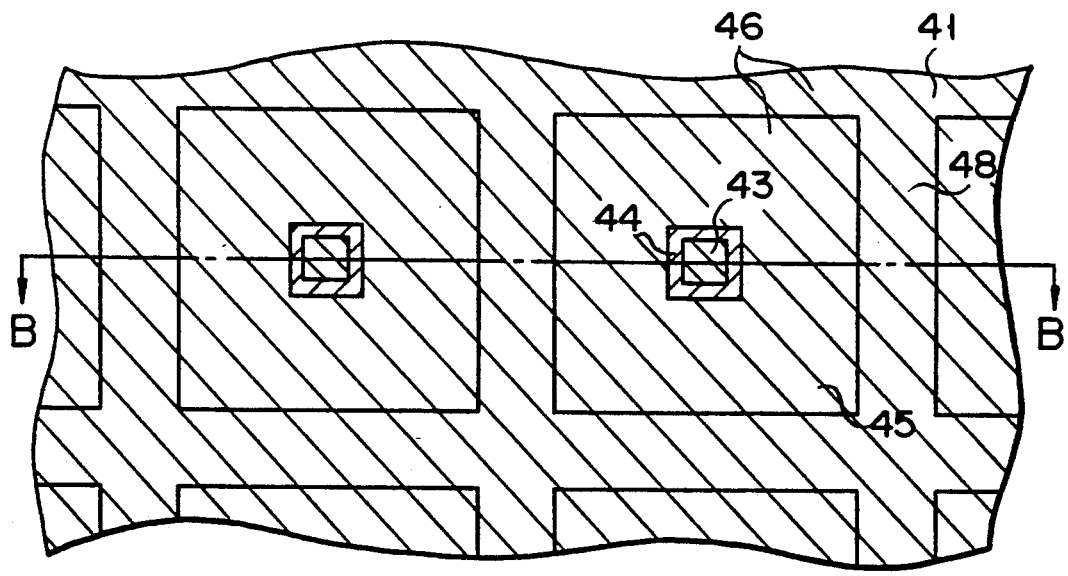
F I G. 2B

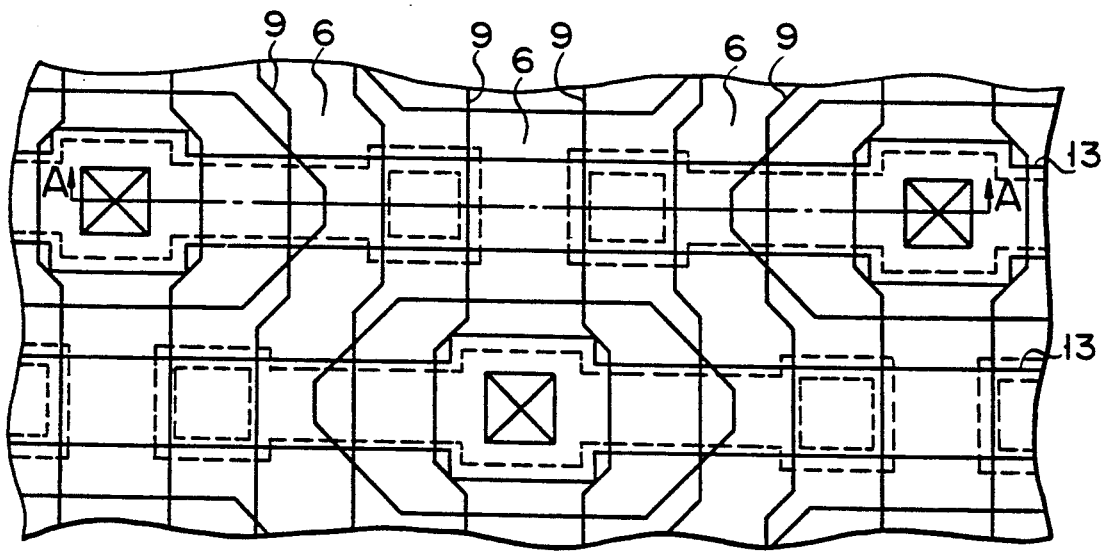
F I G. 4A
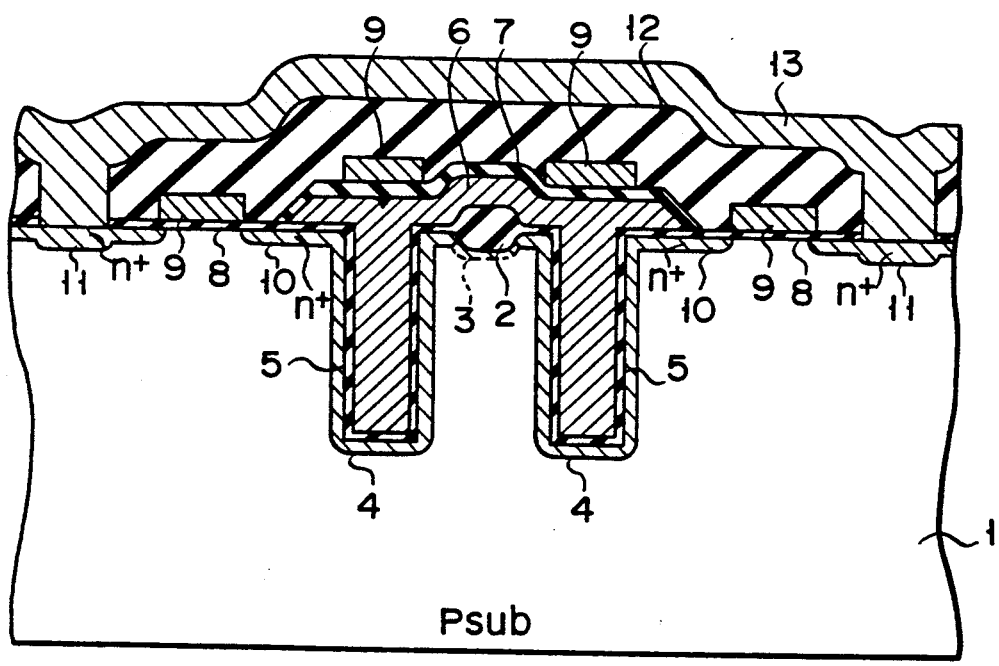
F I G. 4B

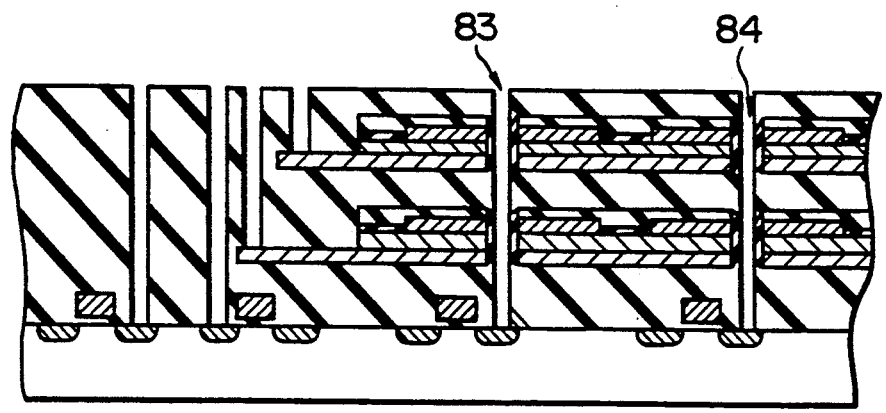
F I G. 5D
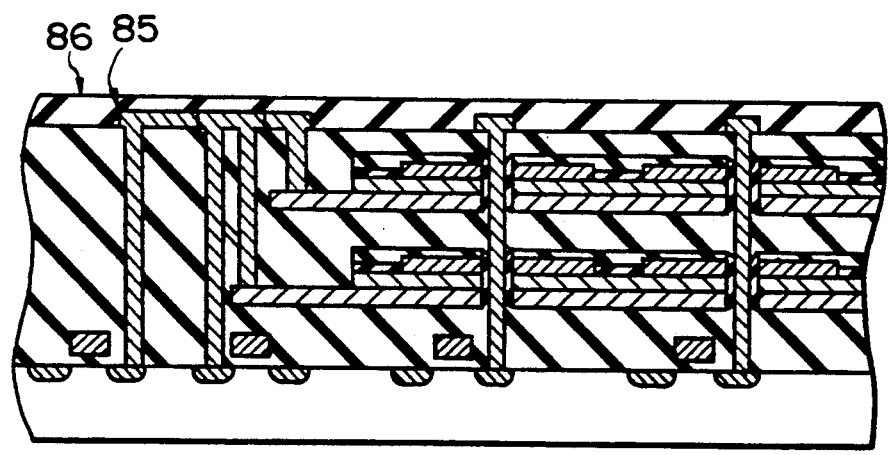
F I G. 5E

SEMICONDUCTOR MEMORY DEVICE WITH A 3-DIMENSIONAL STRUCTURE

This application is a continuation, of application Ser. No. 07/358,278 filed May 30, 1989 now abandoned.

BACKGROUND OF THE INVENTION

1. Field of the Invention

The present invention relates to a semiconductor memory device and, more particularly, to a semiconductor memory device used for a dynamic RAM.

2. Description of the Related Art

A structure of this type of conventional semiconductor memory device is illustrated in FIGS. 4A and 4B. FIG. 4A shows a pattern of the semiconductor memory device, and FIG. 4B a sectional view taken on line A—A of FIG. 4A. Reference numeral 1 designates a p-type semiconductor substrate; 2 a field insulating film; 3 a channel stop impurity layer, 4, 10, and 11 n-type impurity layers; 5 a capacitor insulating film; 6 capacitor electrodes; 7 an interlayer insulating film; 8 a gate insulating film; 9 word lines; and 13 data lines.

Referring to FIG. 4B, a potential applied to the data line 13 is applied to the drain 11 of each transfer transistor whose gate electrode is the word line 9 associated with it. When the potential of the word line 9 is raised, the conductivity of the portion of the substrate directly under the gate insulating film 8 is inverted as a result, data is transferred to the source 10 of the transfer transistor. The source 10 connects to the storage node 4. Charges are stored in a metal insulator semiconductor (MIS) capacitor element, which is formed between the storage node and the capacitor electrode 6. The capacitor insulating film 5 is interlaid between the node and the capacitor electrode.

In the above prior art semiconductor memory device, the memory cells are arrayed two-dimensionally on the major surface of the semiconductor substrate 1. An approach to the 3-dimensional structure has been made. For example, as shown in FIG. 4B, the substrate 1 is trenched. However, so long as the cells are arrayed two dimensionally, the number of cells allowed to be carried on a given chip is limited. In this respect, it cannot be expected that an integration density of the chip is greatly improved.

SUMMARY OF THE INVENTION

Accordingly, an object of the present invention is to provide a semiconductor memory device in which memory cells are arrayed three-dimensionally, thereby providing a high integration density.

Briefly summarized, a semiconductor memory device of the present invention includes: a plurality of planar members (21, 22) spatially arranged; a plurality of conductive wires (23 to 26) passing through the planar members (21, 22); and switching elements (41 to 44) and capacitance elements (45 to 48), these elements being formed in the vicinity of each of the cross points of the conductive planar members (21, 22) and the wires (23 to 26). The switching elements (41 to 44) are each made of a conductive layer and an insulating layer which are layered between the conductive wires (23 to 26) and the planar members (21, 22).

In short, the present invention provides a 3-dimensional memory cell array in which memory cells are respectively located at the cross points of a plurality of planar members (21, 22) arranged in parallel, and a plurality of wires (23, 26) pass through the planar members and are oriented orthogonal thereto. By virtue of such a 3-dimensional memory cell array, the integration density of the semiconductor memory device can be greatly increased.

BRIEF DESCRIPTION OF THE DRAWINGS

FIG. 1 is a schematic illustration of a rough schematic of a physical arrangement of a semiconductor memory device;

FIG. 2A is a sectional view of a part of the semiconductor memory device shown in FIG. 1, and shows details of the structure of the memory device;

FIG. 2B is a plan view of a pattern of the semiconductor memory device of FIG. 1;

FIG. 4A is a plan view of a pattern of a semiconductor memory device to which the present invention is not applied;

FIG. 4B is a sectional view of a pattern of the semiconductor memory device of FIG. 4A;

FIGS. 5A through 5E are sectional views showing a sequence of manufacturing process steps used in a method of manufacturing a semiconductor memory device according to the present invention, the method being called a "laminating method";

FIG. 7 is a sectional view showing a application of the present invention into an EPROM.

DETAILED DESCRIPTION OF THE PREFERRED EMBODIMENTS

Figure 3A:
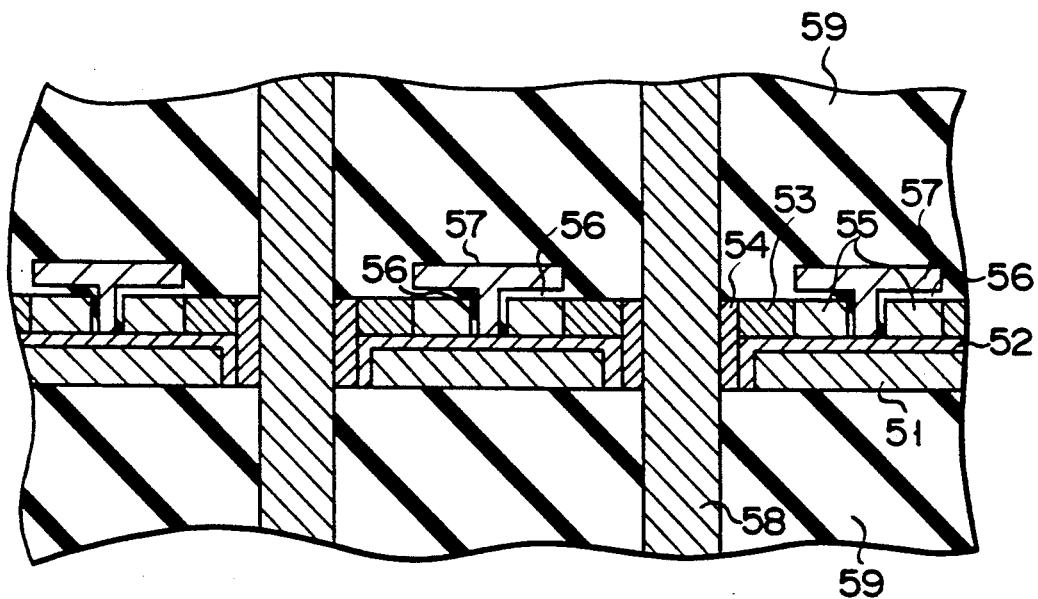
FIG. 3A is a sectional view of a part of the semiconductor memory device according to another embodiment of the present invention.

A semiconductor memory device according to an embodiment of the present invention will now be described, with reference to the accompanying drawings.

FIG. 1 is a rough schematic illustration of a semiconductor memory device according to the present invention, and as is shown, in this figure the semiconductor memory device is made up of two conductive planes, or planar members, 21 and 22, and four wires 23 to 26 which pass through the planar members 21 and 22 and extend in the direction orthogonal thereto. In this instance, there are 8 cross points. The memory cell of the present invention is applicable to any type of memory device i.e., a SRAM, a PROM, or a DRAM; however, in the description to follow, the memory cell is depicted as incorporated in a DRAM. A DRAM cell is normally made up of a switching element, normally consisting of an MIS (Metal-Insulator Semiconductor) FET, and a capacitor element associated therewith. By way of example, the conductive planar members 21 and 22 are used for inputting and outputting data (i.e., they serve as a data planes), and wires 23 to 26 serve as word lines.

The structure of a MISFET, as an example of a DRAM cell, is shown in FIGS. 2A and 2B, FIG. 2A showing a sectional view of a part of the DRAM, and FIG. 2B a pattern of the DRAM. The illustration of FIG. 2A is taken on line B—B in FIG. 2B. Referring to the figures, reference numeral 41 designates a conductive planar member in the form of an N+ type silicon (Si) layer, this layer serving as the source of the MOSFET. Numeral 42 indicates a p-type Si layer, while numeral 43 represents a wire oriented orthogonal to the planar member 41, and which is separated from at least the layers 41, 42, 45, and 46 by an insulating film 44. Numeral 45 denotes an n+ type Si layer, for example, of which as can best be seen in FIG. 2B, a plurality are provided, each located around an associated wire 43, and surrounded by a thin insulating film 47. Preferably, a thick insulating film 48 fills the space between each of the layers 45, and is itself overlaid with a conductive layer 46. At least two stack structures (two layers) each consisting of layers 41 to 46 are provided, which are insulated from each other by an insulating film 49, and through which the wires 43 pass.

In operation, the planar n+ type Si layer 41, or a data plane 41, serves as a wire for the input and output of data to and from the memory cell. That is layer 41 has a function like the data line 13 in FIGS. 4A and 4B. A potential applied to the layer 41 places the wiring 43 in a high potential, the conductivity of that portion of the p-type Si layer 42 which is in contact with the gate insulating film 44 is inverted, and charges are transferred to the charge storage region 45, and stored in a capacitor located between the region 45 and the capacitor electrode 46 which face each other with a capacitor insulating film 47 interlayered between them. Then, if the potential of the wire 43 is decreased, the drain of the n+ Si layer 45 is electrically separated from the data plane 41.

A method of manufacturing the DRAM containing the MISFETs structured as shown in FIGS. 2A and 2B, will now be described. n+ type Si layer 45 is layered on an insulating film 49. When a vapor phase epitaxial method is used for forming these layers, these may be successively formed by appropriately changing doping gases. The n+ type Si layer 45 is selectively etched away so that only those portions thereof corresponding to the cells 50 are left, and a thick oxide film 48 is formed in the space, preferably by means of a selective oxidizing process, to enhance the element separation. Then, a thin insulating film 47 for the capacitor formation is formed on the layers 45, and a capacitor electrode material 46 is deposited over the surface of the resulting structure, followed by an insulating film 49. Second and third layers of active regions are formed in a similar manner to the above. Subsequently, a through-hole is formed at the center of each cell, and a gate insulating film 44 formed on the inner wall of each through hole. In addition, wiring material 43 is buried in each through-hole, by means of an LP (low pressure) CVD method. In this way, a 3-dimensional cell array is completed. The bottom insulating film 49 is formed on an Si substrate, for example.

Figure 3B:
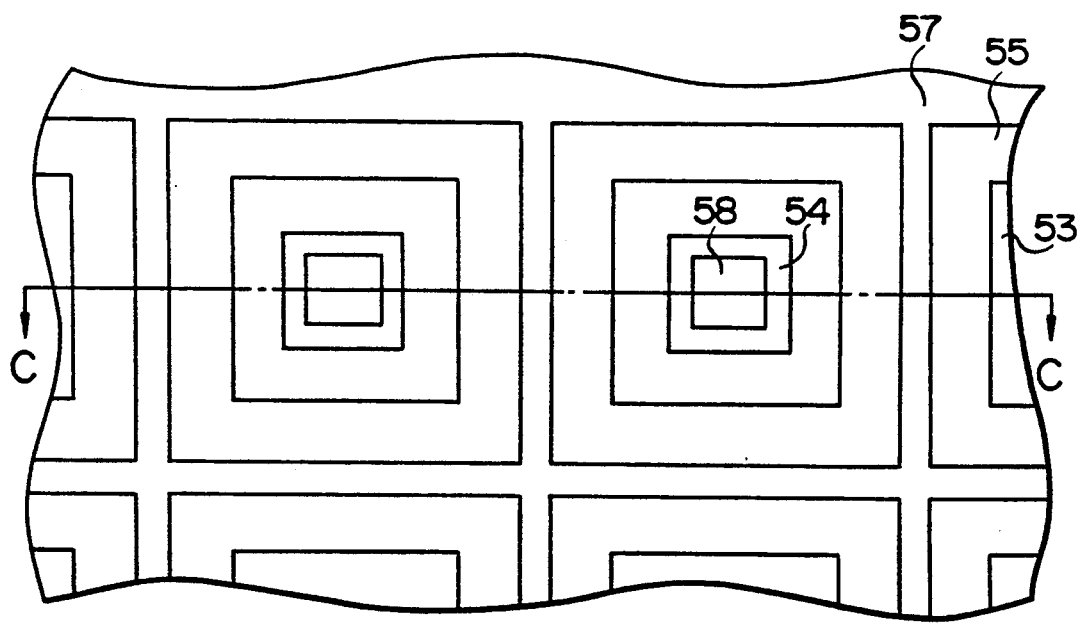
FIG. 3B is a plan view of a pattern of the semiconductor memory device of FIG. 2A.

An example of another cell structure will be described with reference to FIGS. 3A and 3B. FIG. 3A shows a partial cross section of the cell structure which is taken on line C—C FIG. 3B, which shows a plan view of a pattern of the cell structure. In the figures, reference numeral 51 designates a conductive plane or planar member, for example, an n+ type Si layer; 53 a p-type Si layer; 54 an n+ type Si layer; and 55 an n+ type Si layer. A thin insulating film 56, serving as a capacitor insulating film, is laid around the Si layer 55, and is itself covered with a conductive layer 57, serving as a capacitor electrode. A wire 58 passes through the center of Si layer 54 and is electrically connected thereto.

In operation, the wire 58 serves as a data line, and the planar member 51, as a word line 9. A potential applied to the wire 58 is transferred to the Si layer 54, to pull up the potential on the word plane 51, and as a result, the conductivity of that part of the p-type Si layer 53 in contact with the insulating film 52 is inverted, so that data on the wire 58 is transferred to the electrode 55. In this way, charges are stored in a MIS capacitor between the electrodes 55 and 57 which sandwich the capacitor insulating film. In other words, data is stored in the memory cell.

A method of manufacturing the cell array thus structured will now be described.

First an Si layer 51 of + type, for example, is deposited over an insulating film 59, and a central part of each cell is etched away. Next, a gate insulating film 52 and a p-type Si layer 53 are layered on the structure. To form electrodes 54 and 55, the central part and the peripheral part of each cell are made to be of n-type, by means of an ion implanting method. Thereafter, a capacitor film 58 and a capacitor electrode 57 are formed, and an insulating material is applied to the entire major surface of the resultant structure, to form an insulating film 59. A desired number of structures each consisting of layers 51 to 57 are formed, being separated from one another by insulating films 59, and a through-hole is formed in the central part of each cell. Then, wires 58 are buried in the through-holes by means of an LPCVD method, for example.

In the semiconductor memory device having a structure as described above, a memory cell of one bit is formed at each of the cross points of the data planes and the word lines or the word planes and the data lines, the resultant cell array being three-dimensional. Let us consider, for example, a semiconductor structure which contains 100 data planes (or word planes) layered at pitches of 10 um, 2000 word lines (data lines) arrayed at pitches of 2 um in the horizontal direction, and 5000 word lines (data lines) arrayed at the same pitch in the vertical direction (totally 10,000,000). The above figures indicate that a semiconductor structure of 4 mm (width) × 10 mm (height) × 1 mm (depth) may provide a memory cell array of 1 Giga bits. It is assumed that in a DRAM chip of 53 mm (width) × 15 mm (height) × 1 mm (depth), a memory array occupies about half of the height of 1 mm. The memory capacity of this DRAM is approximately 1000 times that of the currently mass produced DRAM of 1 G bits. This figure explicitly describes that the improvement of the memory capacity of the DRAM is remarkable.

Further, a semiconductor memory device according to the present invention may lower the resistance of the wires. The data plane (or word plane) is planar, not a thin line. Therefore, its resistance is in the order of sheet resistance of the material used. The word line (data line) is a thin line. As for the length of it, however, such a short length that the word line passes through the thickness of the chip suffices. The required length is at most 1 mm. The lowering of the resistance word or bit line may also be attained.

The wires (23 to 26) can be made of aluminum or copper or a high-melting point metal such as tungsten or molybdenum, or, more preferably, a higher melting point metallic silicide such as tungsten silicide, molybdenum or silicide.

The planar members (21, 22) can be made of silicon, silicide, or tungsten silicide.

Methods used to form wires passing through the planar members, which may be considered to be difficult, will now be described. In a first method of forming the wires, a plurality of planar members are formed and are laminated, and holes are formed in the laminated planar members, through which the wiring passes. This method is, naturally, called a "laminating method".

Figure 5A:
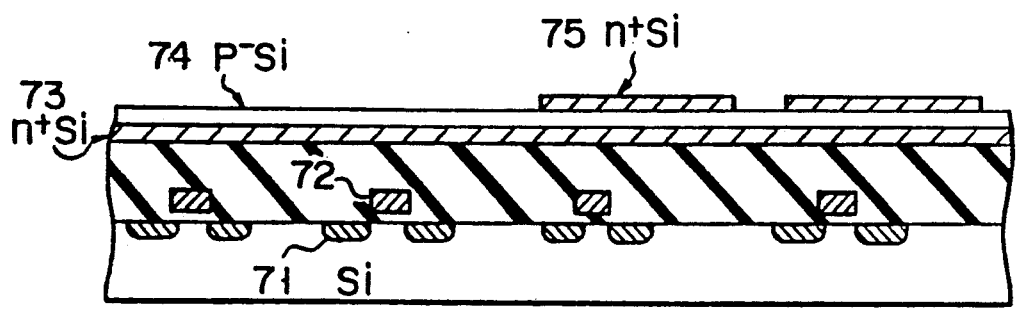

The laminating method used to manufacture a semiconductor memory device according to the present invention will now be described, with reference to FIGS. 5A through 5E. As is shown in FIG. 5A, insulating films 72 are formed on transistor components 71 formed in the upper surface of a silicon substrate. Further, an n+ type Si layer 73 serving as a data plane, and an n+ type Si layer 73 are formed. Further, a p-type Si layer 74 and n+ type Si layer 75 as charge storage portions are successively formed.

Figure 5B:
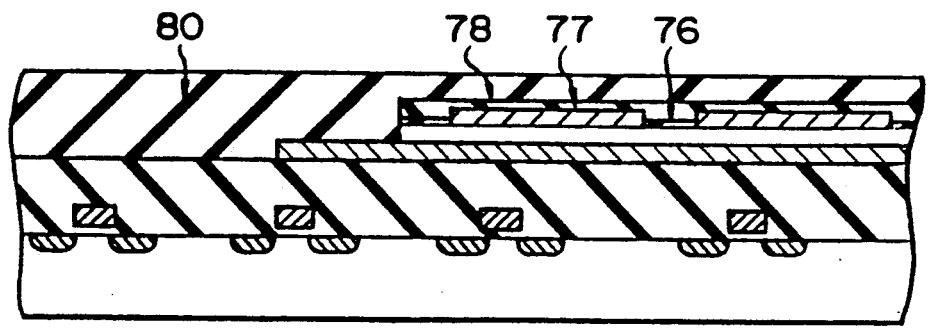

As is shown in FIG. 5B, an insulating film 76 for separating elements is formed on the above-described structure. Thereafter, capacitor insulating films 77 are formed, and additionally capacitor electrodes 78 are formed. The channel type plane 74 (p-type Si layer) 74 and the capacitor electrode 78 are patterned. Then, a first insulating film 80 is layered over the resultant structure. At this point, the formation of a first planar member is completed.

Figure 5C:
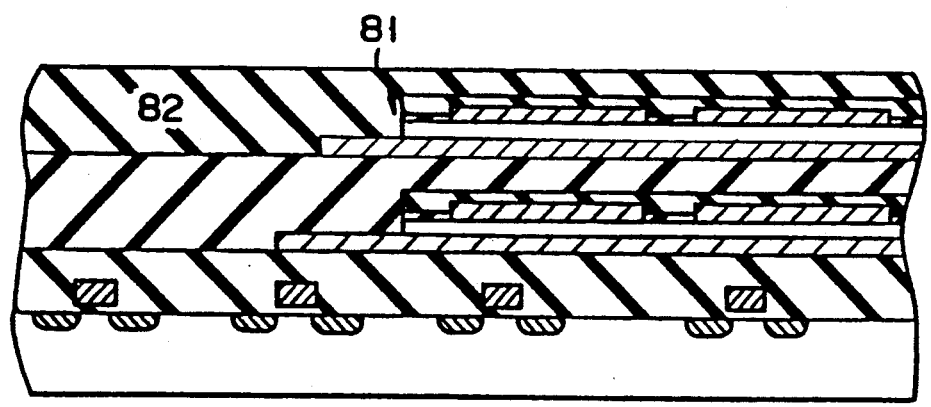

As is shown in FIG. 5C, a second planar member 81 is formed over the first planar member, and a second insulating film 82 is laid thereover, through a sequence of process steps similar to that used to form the first planar member. If necessary, third and subsequent planar members may be formed in similar ways.

As is shown in FIG. 5D, contact holes 84 are formed to enable wires to be implanted in the stacked planar members, and a thermal oxide layer 83 of Si, for separating the respective layers of the structure, is formed on the inner side wall of each contact hole 84.

As is shown in FIG. 5E, wires 85 are buried into the contact holes 83, respectively, and a third insulating film 86 is laid over the structure thus formed.

In brief, according to the laminating method described above, a desired number of planar members are first formed into a stack of planar members. Thereafter, contact holes are formed and wires buried therein.

Another method of manufacturing a semiconductor memory device according to the present invention is called a "stacking method". In this method, a first planar member is formed, and contact holes are formed in the planar member, and then wires are buried in the contact holes, respectively. A second planar member is formed, and the formed planar member is holed for contact hole, and wires are buried into the holes. The process is repeated by the number of times equal to a necessary number of planar members. Finally, the planar member thus formed are stacked and wired.

The stacking method will be described with reference to FIGS. 6A through 6D.

Figure 6A:
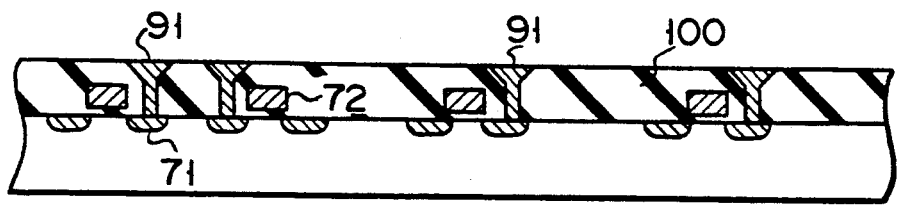
FIGS. 6A through 6D are sectional views showing a sequence of manufacturing process steps used in another method of manufacturing a semiconductor memory device according to the present invention, the method being called a "stacking method"

As shown in FIG. 6A, a peripheral circuit and transistors 71 and 72 are formed in the surface region of an Si substrate. An insulating film 100 is applied to the entire surface of the structure. Then, contact holes 91 are formed in the structure and then conductive material 91 are filled into the contact holes.

Figure 6B:
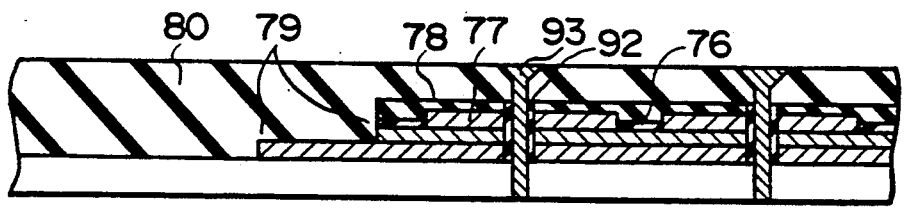

As shown in FIG. 6B, a planar member is formed in a manner as shown in FIGS. 5A and 5B. Contact holes 93 are formed in the planar member, an oxide film 92 is applied to the inner side wall of each contact hole, and a first wire 93 is completed. Those steps are not found in the "laminating method". Thus, the wiring is performed for each planar member. This improves the accuracy of the wiring. A sequence of the above process steps is repeated the number of times equal to a desired number of planar members.

Figure 6C:
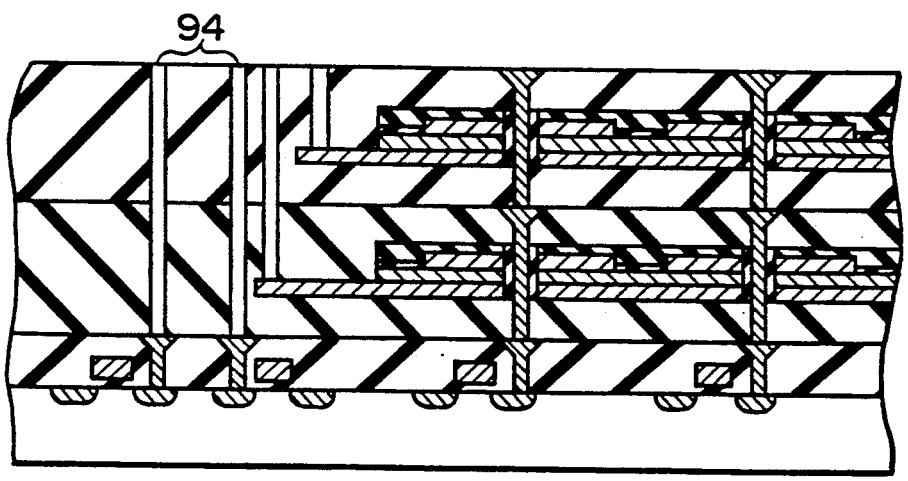
Figure 6D:
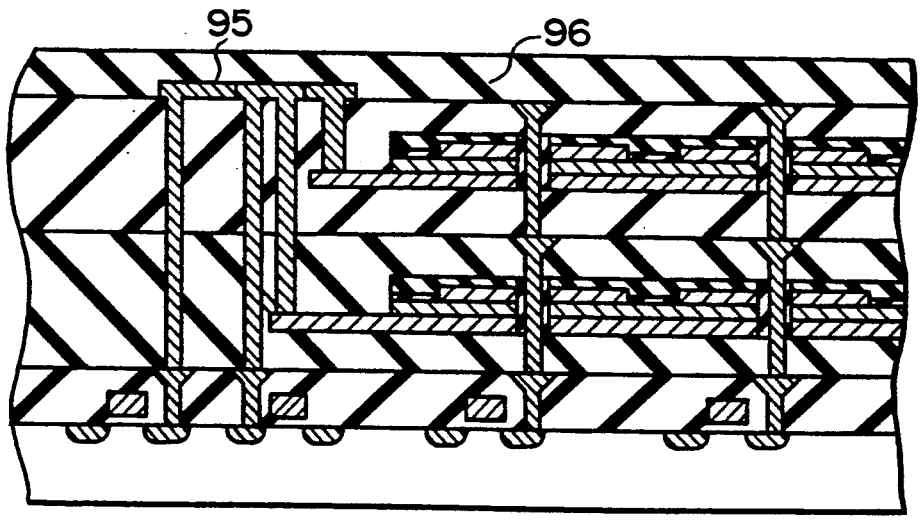

As shown in FIG. 6C, the planar members thus formed are bonded together. The bonding is made by thermal process of 900° to 1000° C. Thereafter, contact holes 94 are further formed, and a second interconnection wire 95 is buried thereinto as shown in FIG. 6D, to complete a semiconductor memory device. In the stacking method, a number of process steps is increased, but a wiring accuracy is improved because the wiring is made every planar member.

An application of the present invention into an EPROM is illustrated in FIG. 7. In the figure, reference numeral 106 designates a control gate; 107 a floating gate; 108 a source; 109 a channel region; and 110 a drain region.

As seen from the foregoing description, the present invention has succeeded in providing a semiconductor memory device with an improved integration density and of a low interconnection wire resistance.

What is claimed is:

1. A semiconductor memory apparatus having a semiconductor substrate comprising:
    a first block of field-effect-transistor-memory structure on said substrate and a second block of field-effect-transistor memory structure which is directly on said first block; and
    a plurality of gate layers serving as word lines, each of which penetrates each of said first and second blocks to intersect said field-effect-transistor memory structures of said first and second blocks,
    wherein each of said first block and second block comprises:
        a first insulating layer;
        a first silicon layer of first conductivity type on said first insulating layer, serving as a source of at least one field-effect transistor and serving as a data line;
        a second silicon layer of second conductivity type on said first silicon layer serving a channel of said field-effect transistor;
        a third silicon layer of said first conductivity type on said second silicon layer serving a drain of said field-effect transistor;
        a second insulating layer on said third silicon layer; and
        a first conductive layer on said second insulating layer providing a capacitor between first conductive layer and said third silicon layer.

2. A semiconductor memory apparatus having a semiconductor substrate comprising:
    a first block of field-effect-transistor memory structure on said substrate and a second block of field-effect-transistor memory structure which is directly on said first block; and
    a plurality of data line layers, each of which penetrates said first and second blocks to intersect said field-effect-transistor memory structures of said first and second blocks;
    wherein each of said first block and second block comprises:
        a first insulating layer;
        a first conductive layer on said first insulating layer, serving as a word line and serving as a gate of at least one field-effect transistor;

a second insulating layer on said first conductive layer;
a first silicon layer of first conductivity type on said second insulating layer serving as a source of said field-effect transistor;
a second silicon layer of second conductivity type on said second insulating layer, said second silicon layer being adjacent to said first silicon layer and serving as a channel of said field-effect transistor;
a third silicon layer of said first conductivity type on said second insulating layer, said third silicon layer being adjacent to said second silicon layer and serving as a drain of said field-effect transistor;
a third insulating layer on said third silicon layer; and
a second conductive layer on said third insulating layer providing a capacitor between said second conductive layer and said third silicon layer.

3. A semiconductor electrically erasable programmable read only memory apparatus having a semiconductor substrate comprising;
a first block of field-effect-transistor memory structure on said substrate and a second block of field-effect-transistor memory structure which is directly on said first block; and
a plurality of gate layers, each of which penetrates said first and second blocks to intersect said field-effect-transistor memory structure of said first and second blocks;
wherein each of said first block and second block comprises;
an insulating layer;
a first silicon layer of first conductivity type on said insulating layer, serving as a source of at least one field-effect transistor;
a second silicon layer of second conductivity type on said first silicon layer, serving as a channel of said transistor;
a third silicon layer of said first conductivity type on said second silicon layer, serving as a drain of said transistor;
a conductive layer on said insulating layer, said conductive layer being near said second silicon layer; and
a second insulating layer separating said conductive layer from said second silicon layer, said conductive layer serving as a floating gate of said transistor.

4. A semiconductor memory apparatus having a semiconductor substrate comprising;
a first block of field-effect-transistor memory structure on said substrate and a second block of field-effect-transistor memory structure which is directly on said first block, each of said first block and second block comprising a plurality of field-effect transistors wherein each of said first block and second block comprises:
a silicon layer; and
a plurality of gate layers, each serving as a word line of said memory apparatus and each of which penetrates said first and second blocks to intersect selected transistors of said field-effect-transistor memory structures of said first and second blocks.

* * * * *